(12) United States Patent
Morzano

(10) Patent No.: US 7,116,133 B2
(45) Date of Patent: *Oct. 3, 2006

(54) APPARATUS AND METHOD FOR ADJUSTING CLOCK SKEW

(75) Inventor: Christopher K. Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/870,138

(22) Filed: Jun. 18, 2004

(65) Prior Publication Data

US 2004/0233742 A1    Nov. 25, 2004

Related U.S. Application Data

(62) Division of application No. 09/354,302, filed on Jul. 16, 1999, now Pat. No. 6,791,370.

(51) Int. Cl.
*H03K 5/22* (2006.01)

(52) U.S. Cl. .......................................... 327/57; 327/55

(58) Field of Classification Search ........... 365/189.02, 365/189.05, 233, 233.5; 327/295, 298
See application file for complete search history.

(56) References Cited

U.S. PATENT DOCUMENTS

| | | | |
|---|---|---|---|
| 4,169,233 A | 9/1979 | Haraszti | |
| 4,608,670 A | 8/1986 | Duvvury et al. | |
| 5,045,725 A * | 9/1991 | Sasaki et al. | 326/37 |
| 5,162,681 A | 11/1992 | Lee | |
| 5,243,573 A | 9/1993 | Makihara et al. | |
| 5,334,890 A | 8/1994 | Hardee | |
| 5,534,800 A | 7/1996 | Hiraki et al. | |
| 5,537,066 A | 7/1996 | Kawashima | |
| 5,552,737 A | 9/1996 | Chen | |
| 5,666,324 A * | 9/1997 | Kosugi et al. | 365/233 |
| 5,828,239 A * | 10/1998 | Lotfi | 327/51 |
| 5,838,173 A | 11/1998 | Oh | |
| 5,939,903 A | 8/1999 | Lin | |
| 5,949,259 A | 9/1999 | Garcia | |
| 6,008,673 A | 12/1999 | Glass et al. | |
| 6,029,250 A * | 2/2000 | Keeth | 713/400 |
| 6,037,808 A | 3/2000 | Houston et al. | |
| 6,049,505 A | 4/2000 | Fister | |
| 6,278,653 B1 * | 8/2001 | Hardee | 365/233 |

* cited by examiner

*Primary Examiner*—Timothy P. Callahan
*Assistant Examiner*—An T. Luu
(74) *Attorney, Agent, or Firm*—Dickstein Shapiro Morin & Oshinsky LLP

(57) ABSTRACT

The present invention provides a clock signal input circuit that is able to provide inverse internal clock signals generated by the same input buffer as the address and data signals which exhibit reduced skew. When a skewed external noninverse clock signal and a corresponding external inverse clock signal are passed through respective reference voltage input buffers there is no reduction in skew between the two internal signals. In a preferred embodiment, the invention provides back to back inverters connected to both lines carrying the noninverted and inverted internal clock signals. The slower internal clock signal has an extra inverter driving it when it switches states and the faster internal clock signal has an extra inverter fighting it when it switches states. The skew of the two signals is reduced, allowing for faster operation of the integrated circuit and a reduction in misread data signals.

34 Claims, 12 Drawing Sheets

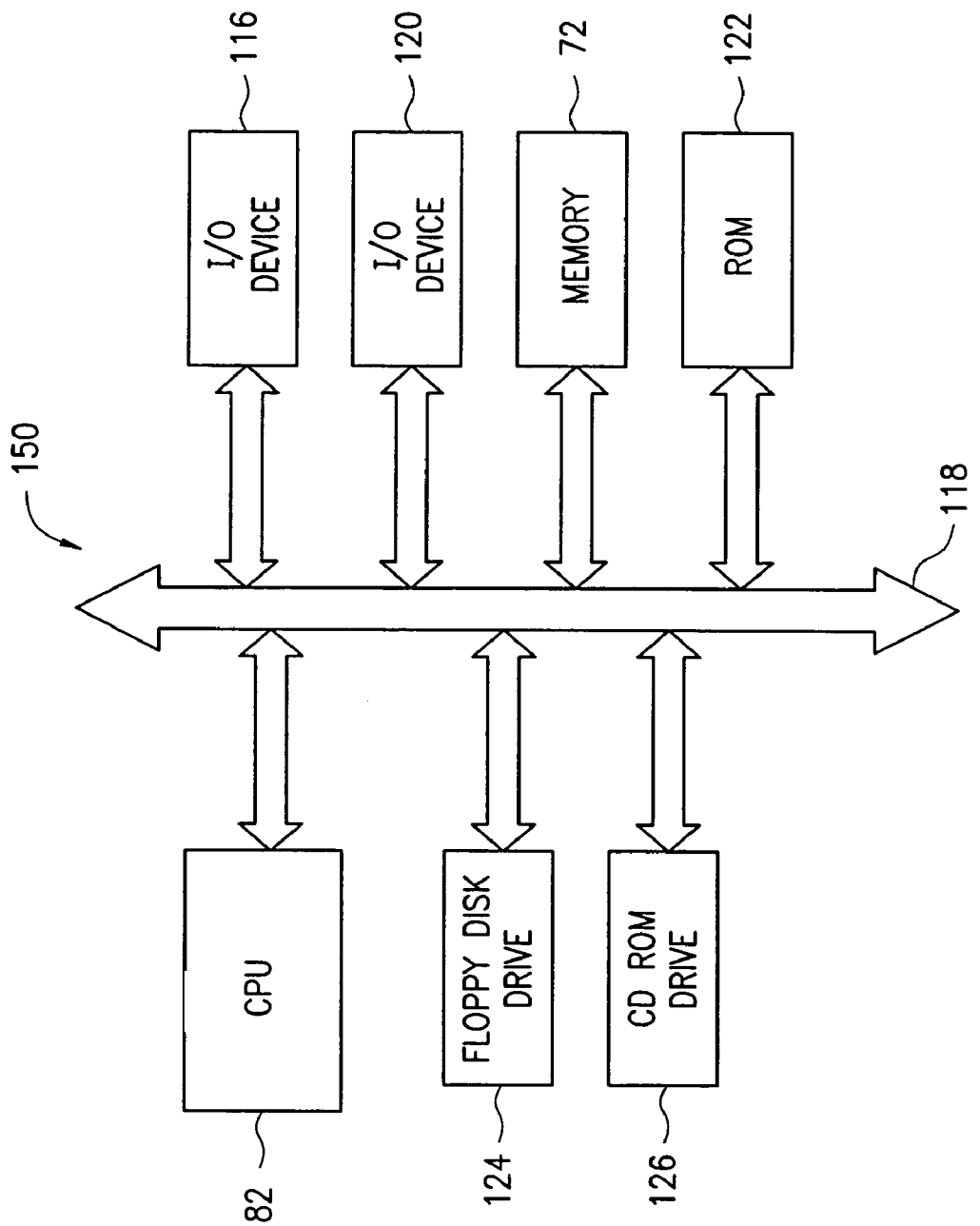

APPARATUS AND METHOD FOR ADJUSTING CLOCK SKEW

CROSS REFERENCE TO RELATED APPLICATIONS

The present application is a divisional of U.S. application Ser. No. 09/354,302, filed on Jul. 16, 1999, now U.S. Pat. No. 6,791,370, the disclosure of which is herewith incorporated by reference in its entirety.

BACKGROUND OF THE INVENTION

1. Field of the Invention

This invention relates to integrated circuit chips and, in particular, to differential input buffers capable of reducing clock signal skew.

2. Description of the Related Art

Internal circuit functions in synchronous integrated circuits, e.g. SDRAM chips, are performed in response to transitions of an internal clock signal. Clock signals are signals that vary between a low voltage and a high voltage at regular intervals and are referenced to a fixed voltage, typically either the low voltage or the high voltage. The internal clock signal is derived from an external clock signal that has been passed through an input buffer as it enters the integrated circuit. The input buffer detects transitions in the external clock signal and outputs an internal clock signal, usually at a different reference voltage than the external clock signal.

Some circuits require differential input clock signals at a pair of terminals, i.e., signals that vary in opposed fashion. For example, delay stages in many delay-locked loops require high-speed, low-skew differential inputs for proper operation. Additionally, phase comparators in such delay-locked loops may also utilize differential input signals. Because integrated circuit devices that include such delay-locked loops often receive only single-ended signals, the single-ended signals often must be converted to differential signals. Thus, the input buffer circuit may also produce complimentary internal clock signals where one signal follows the external clock signal, and the second signal follows the inverse of the external clock signal.

However, when a buffer circuit produces complimentary output signals, the output signals are susceptible to skew. For example, a first data signal generated and driven using a first internal clock signal is to be sampled by a second data signal driven by a second internal clock signal, the inverse of the first internal clock signal. If the two clock signals are skewed, e.g. they are out of phase with one another, then the first data signal may arrive too early or too late to be sampled by the second data signal. This situation is referred to as a "race condition" and is a result of excessive skew between two or more internal clock signals. Race conditions can cause an incorrect data value to be read when a data signal is sampled since the first data signal is not present when it is to be sampled. Therefore, race conditions can cause an integrated circuit to malfunction.

One approach to converting a single-ended signal into a differential signal is to run a single-ended external clock signal CLK through an inverter to produce an inverted signal CLK\. The noninverted and inverted signals CLK, CLK\ are then output at a pair of terminals as a differential signal. Because of the extra path length the inverted signal CLK\ travels, this signal arrives at the pair of terminals slightly after the noninverted signal CLK. The skew of the two signals is typically on the order of 50 picoseconds or more, even with a very fast inverter. Such skew times are unacceptable for some applications, such as very low jitter delay locked loops and phase-locked loops. In such circuits, skewed input signals can cause instability, drift and jitter in the output signals.

The skew of signals CLK and CLK\ is illustrated in the timing diagram shown in FIG. 8. Signal CLK is low and signal CLK\ is high at time T1. At time T1, signal CLK transitions to a high state. Signal CLK\ begins to transition to a low state at time T2, the same time signal CLK reaches the end of its transition to a high state. At time T3, CLK reaches the end of its transition to a low state. The difference between T2 and T3 represents the skew of the signals CLK and CLK\.

In some cases the external clock signals arrive at an input buffer already in complimentary form. FIG. 9 illustrates in circuit diagram form a conventional differential input buffer circuit 200 used to produce and drive an internal clock signal CLK and inverse clock signal CLK\ from external clock signals XCLK and XCLK\, respectively. The circuit 200 generally comprises an input buffer 202 and a pair of clock driver circuits 204.

A typical input buffer 202 for use in a conventional differential input buffer circuit 200 is illustrated in circuit diagram form in FIG. 10. N-channel transistors 204 and 206 are connected to P-channel input transistors 208 and 210, respectively, to form a differential amplifier. The common source of P-channel input transistors 208 and 210 is connected to voltage supply $V_{CC}$ 212 through P-channel transistors 214 and 216. The common drain of N-channel input transistors 204 and 206 is connected to ground $V_{SS}$ 218 through N-channel transistor 220. Clock signal CLK on line 222 is coupled to the gate of P-channel transistors 208 and 210 and N-channel transistors 204 and 206. N-channel transistors 226 and 228 are connected to P-channel transistors 230 and 232, respectively, to form a differential amplifier. The common source of P-channel transistors 230 and 232 is connected to positive voltage supply $V_{CC}$ 212 through P-channel transistors 214 and 216. The common drain of N-channel input transistors 226 and 228 is connected to ground $V_{SS}$ 218 through N-channel transistor 220. Clock signal CLK\ on line 224 is coupled to the gate of P-channel transistors 230 and 232 and N-channel transistors 226 and 228.

The output of the differential amplifiers at terminals 234 and 236 is coupled to the input of a pair of high threshold inverters formed by, respectively, P-channel transistors 238, 242, N-channel transistors 240, 244, voltage supplies 246, 250, and ground points 248, 252. The output of the high threshold inverters at terminals 254 and 256 provides internal clock signals CLK and CLK\.

In operation, when the enabling signal ENi is high, P-channel transistor 214 is off and N-channel transistors 258 and 260 are off due to the inversion of the signal ENi by inverter 262. When control signal ENi goes low, P-channel transistor 214 is on, N-channel transistors 258 and 260 are on, and the differential amplifier is enabled.

When XCLK is high, P-channel transistors 208 and 210 are off and N-channel transistors 204 and 206 are on. Simultaneously, XCLK\ is low since it is the inverse of XCLK and P-channel transistors 230 and 232 are on and N-channel transistors 226 and 228 are off. Therefore, when XCLK is high and XCLK\ is low, terminal 234 is driven low, to $V_{SS}$, and terminal 236 is driven high, to $V_{CC}$. When terminal 234 is low, P-channel transistor 238 is on and N-channel transistor 240 is off, driving terminal 246 high, to $V_{CC}$. When terminal 236 is high, P-channel transistor 242 is off and N-channel transistor 244 is on, driving terminal 248 low, to $V_{SS}$. In comparison, when XCLK is low and XCLK\ is high, terminal 234 is high which drives terminal 246 low and terminal 236 is low which drives terminal 248 high.

While such a circuit buffers the external clock signals, it does not eliminate any pre-existing skew between the external clock signals. In addition, though it is useful for the regulated portion of an integrated circuit the resulting internal clock signals do not track well with the address and data inputs across the circuits operating voltage. Due to the large number and interdependence of transistors, the gate loading for this circuit leads to crossing point accuracy problems in response to fluctuations in voltage and temperature conditions.

Thus, there exists a need for a circuit to produce internal clock signals which exhibit less clock signal skew and which track well with address and data inputs, and are less susceptible to environmental conditions.

SUMMARY OF THE INVENTION

The present invention provides a clock signal input circuit that is able to provide inverse internal clock signals exhibiting reduced skew which are generated by the same input buffer as the address and data signals on an integrated circuit.

In a preferred embodiment, a skewed external noninverse clock signal and a corresponding external inverse clock signal are passed through respective reference voltage input buffers to produce internal clock signals. The internal clock signals are generated by the same input buffer as the address and data inputs. To reduce skew, back to back inverters are connected to both lines carrying the noninverted and inverted internal clock signals from the respective reference voltage input buffers. The slower internal clock signal has an extra inverter driving it when it switches states, e.g. from a high state to a low state, and the faster internal clock signal has an extra inverter fighting it when it switches states. The skew of the two signals is reduced, allowing for faster operation of the integrated circuit and a reduction in error in downstream circuits using the two signals.

BRIEF DESCRIPTION OF THE DRAWINGS

The foregoing and other advantages and features of the invention will become more apparent from the detailed description of the preferred embodiments of the invention given below with reference to the accompanying drawings in which:

FIG. 11 is a block diagram of a processor based system using the memory module of FIG. 7.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. Wherever possible, like numerals are used to refer to like elements and functions between the different embodiments of the present invention.

Figure 1:
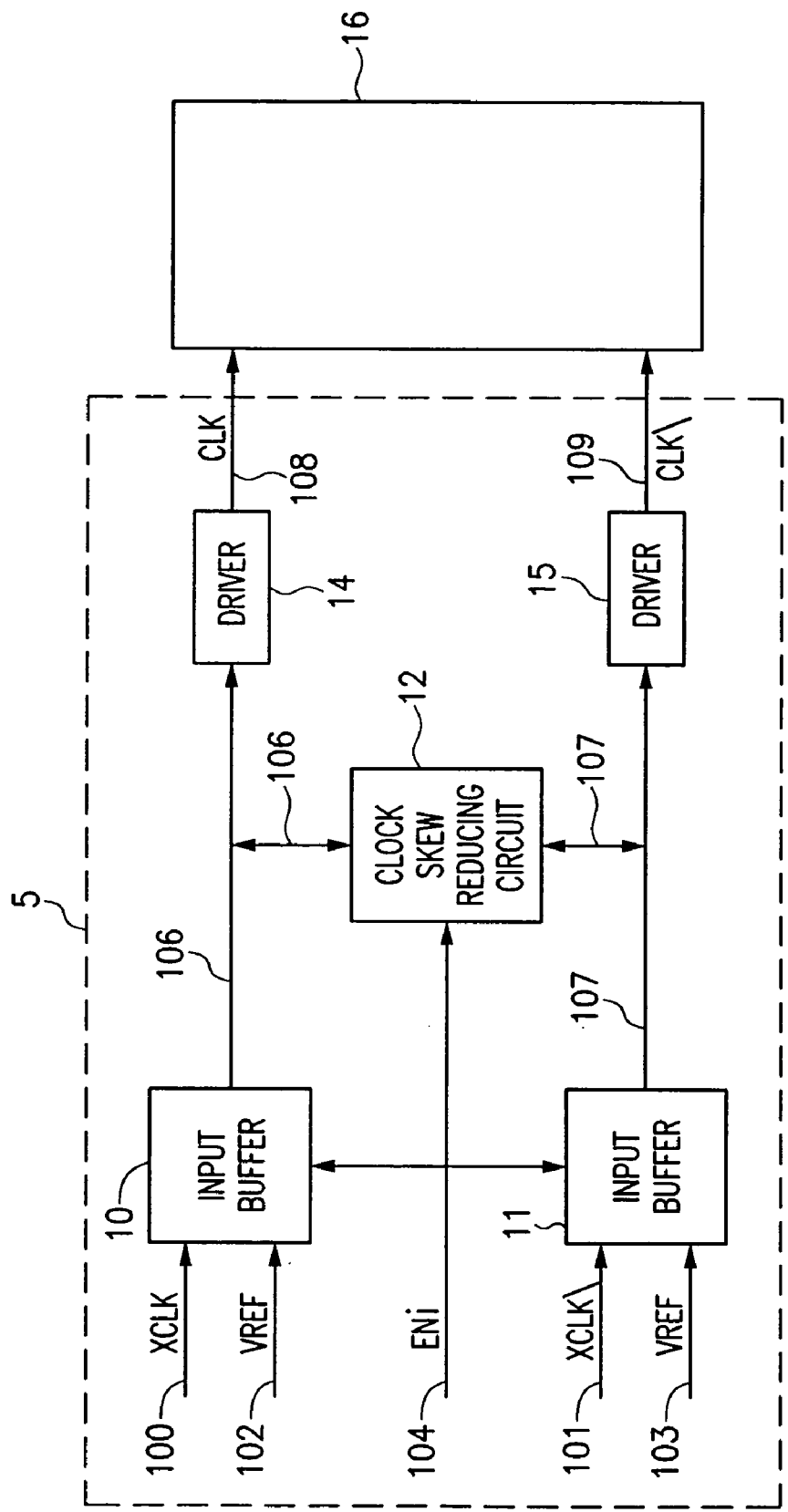
FIG. 1 is a block diagram of a clock skew reducing input buffer circuit of the present invention.

FIG. 1 shows a preferred embodiment of a circuit 5 of the present invention which buffers and drives incoming external clock signals CLK, CLK\ in addition to compensating for signal skew variations. The circuit 5 itself may be part of an integrated circuit which requires buffered internal clock signals exhibiting low skew, e.g. SDRAM chips.

The circuit 5 has at least two reference voltage input buffers 10, 11 each receiving an external clock signal XCLK and XCLK\ from lines 100, 101, respectively, a reference voltage signal $V_{REF}$ from lines 102, 103, respectively, and an enable signal ENi from line 104. The reference voltage input buffers 10, 11 are each connected to clock skew reducer circuit 12 and drivers 14, 15 through lines 106, 107 respectively. Drivers 14 and 15 are preferably connected to any number of integrated circuit elements known in the art, e.g. a memory array 15.

Figure 2:
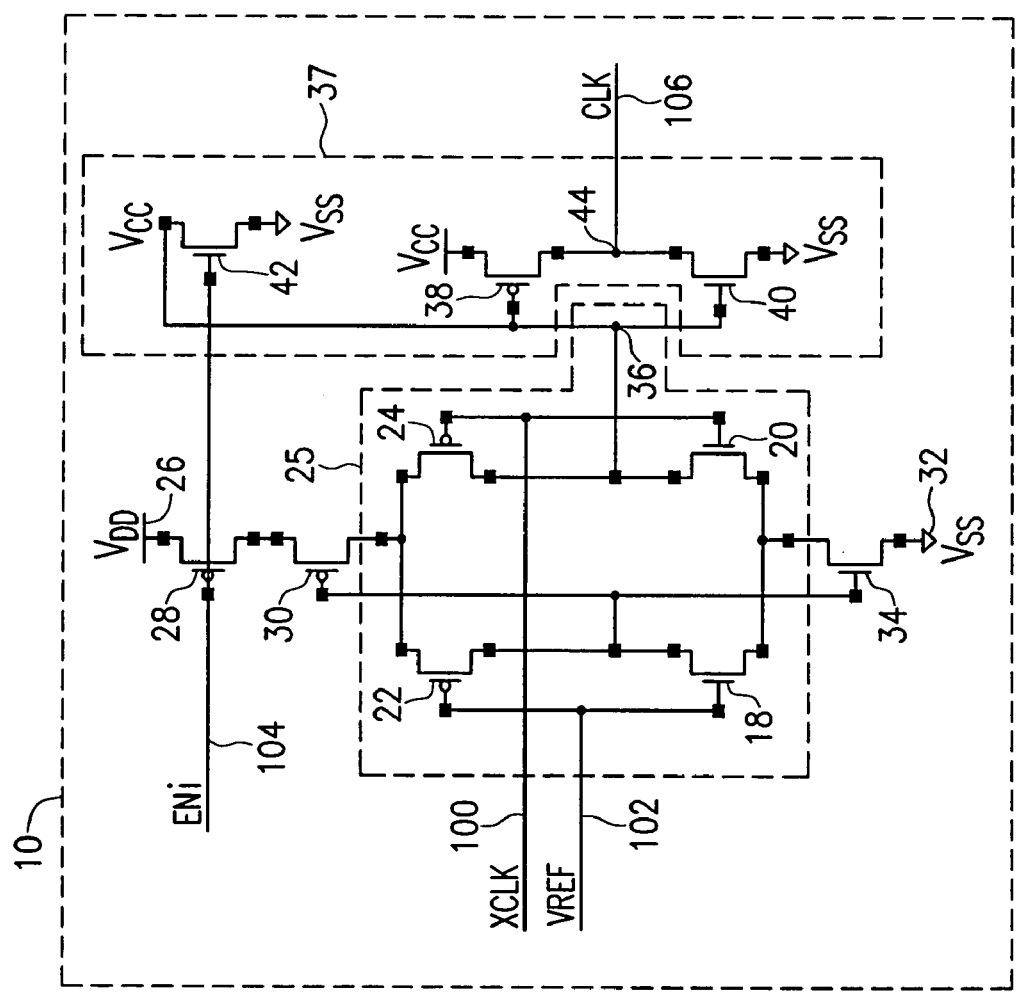
FIG. 2 is a schematic diagram of a reference voltage input buffer circuit shown in FIG. 1.

A typical reference voltage input buffer 10 which may be used in the preferred embodiment of the invention is shown in FIG. 2. For the purposes of example, the input buffer 10 for the non-inverse external clock signal XCLK is shown, though the input buffer 11 for the inverse clock signal XCLK\ is identical in structure and operation. N-channel transistors 18 and 20 are connected to P-channel input transistors 22 and 24, respectively, to form a differential amplifier 25. The common source of P-channel transistors 22 and 24 is connected to voltage supply ($V_{CC}$) 26 through P-channel transistors 28 and 30. $V_{CC}$ 26 is the internal voltage of the circuit 5. The common source of N-channel input transistors 18 and 20 is connected to ground ($V_{SS}$) 32 through N-channel transistor 34. Reference signal $V_{REF}$ on line 102 is coupled to the gate of P-channel input transistor 22 and N-channel transistor 18. $V_{REF}$ is preferably the reference voltage for the address and data signal inputs of the integrated circuit of which circuit 5 is a portion thereof. The external clock signal XCLK on line 100 is coupled to the gate of P-channel transistor 24 and N-channel transistor 20. The output of the differential amplifier 25 at terminal 36 is coupled to the input of a high threshold inverter 37 formed by P-channel transistor 38 and N-channel transistors 40 and 42. The output of the high threshold inverter 37 at terminal 44 is internal clock signal CLK and is output on line 106. Though one particular type of reference voltage input buffer 10 has been described herein, it should be understood that any reference voltage input buffer known in the art may be substituted. In addition, any differential input buffer known in the art may also be substituted for reference voltage input buffer 10.

Input buffer 11 is preferably identical in operation and construction to input buffer 11, described above, though it may be any buffer circuit capable of buffering an external clock signal to an internal voltage supply ($V_{CC}$). Similar to input buffer 10, the input buffer 11 receives the external inverse clock signal XCLK\ and buffers the signal to produce an output which is the internal inverse clock signal CLK\.

In operation, when the enabling signal ENi is high, P-channel transistor 28 is off and N-channel transistor 42 is on. Thus, the differential amplifier 25 is disabled, terminal 36 of the differential amplifier 25 is low, terminal 44 of the high threshold inverter 37 is high, and, therefore, CLK is held high. When control signal ENi goes low, P-channel transistor 28 is on, N-channel transistor 42 is off, and the differential amplifier 25 is enabled. XCLK is then compared with reference signal $V_{REF}$ by P-channel transistors 22 and 24. If XCLK is in a high state, having a voltage greater than reference signal $V_{REF}$, P-channel input transistor 24 is less conductive than P-channel input transistor 22 and the output at terminal 36 goes low. This causes transistor 38 to become more conductive, thus driving terminal 44 high to $V_{CC}$. If XCLK is in a low state, having a lower voltage than reference signal $V_{REF}$, terminal 36 will be driven high, making N-channel transition 40 more conductive and driving terminal 44 low, to ground. This results in CLK on line 106 being held in a low state.

When the input buffers 10, 11, as shown in FIG. 1, are operating to buffer respective incoming signals XCLK and XCLK\, they provide internal clock signals CLK and CLK\ on respective lines 106, 107. The input buffer 10 for incoming signal XCLK will latch when XCLK crosses $V_{REF}$, the threshold voltage. Similarly, the input buffer 11 for incoming signal XCLK\ will latch when XCLK\ crosses $V_{REF}$. With the use of the relatively low transistor-count reference voltage input buffers 10, 11, the dependence of the circuit 5 on adverse environmental conditions is decreased. This is a benefit since adverse environmental conditions, e.g. high temperatures, can lead to a greater chance of skew and race conditions. However, specifications for synchronous circuits base clock transitions upon the crossing point of CLK and CLK\. The input buffers 10, 11 do not reduce the skew between the CLK and CLK\ signals. To accomplish a reduction in skew, a clock skew reducing circuit 12 is connected to CLK and CLK\ output lines 106, 107 as shown in FIGS. 1 and 2.

Figure 3:
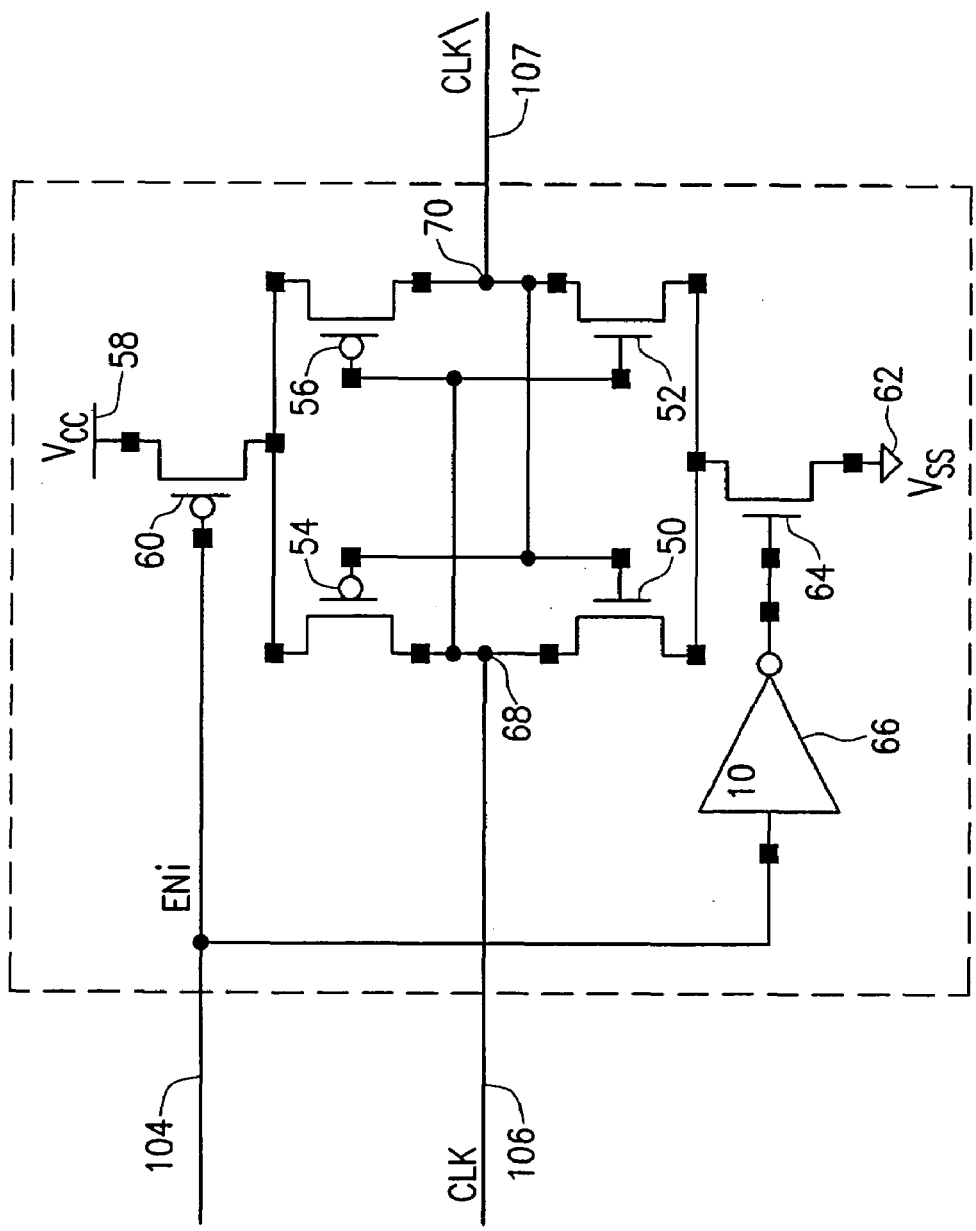
FIG. 3 is a schematic diagram of a clock skew reducing circuit shown in FIG. 1.

The clock skew reducing circuit 12 is shown in more detail in FIG. 3. N-channel transistors 50 and 52 are connected to P-channel transistors 54 and 56, respectively, to form a pair of back-to-back inverters. The common source of P-channel transistors 54 and 56 is connected to voltage supply ($V_{CC}$)58, which is preferably the same voltage supply as $V_{CC}$ 26, through P-channel transistor 60, gated by enable signal ENi on line 104. The common source of N-channel transistors 50 and 52 is connected to ground ($V_{SS}$)62 through N-channel transistor 64, gated by enable signal ENi on line 104 which has been driven through inverter 66.

The CLK signal on line 106 is coupled to the gate of P-channel transistor 56 and N-channel transistor 52, the drain of P-channel transistor 54, and the source of N-channel transistor 50. The signal CLK\ on line 107 is coupled to the gate of P-channel transistor 54 and N-channel transistor 50, the drain of P-channel transistor 56, and the source of N-channel transistor 52. In operation, when the enabling signal ENi is high, P-channel transistor 60 is off and N-channel transistor 64 is off. Thus, the clock skew reducing circuit 10 is disabled. When control signal ENi goes low, P-channel transistor 60 is on and N-channel transistor 64 is on which enables the clock skew reducing circuit 12.

To reduce skew between the signals CLK and CLK\, the clock skew reducing circuit 12 drives the slower signal and inhibits the faster signal in the following manner. When two signals are skewed, one is considered "faster" than the other. The term "faster" refers to a comparison of the points in time at which the two signals reach a transition, e.g. crossing $V_{REF}$. For example, if signal CLK is faster than signal CLK\, signal CLK will transition, e.g., from a low to high state, before CLK\ transitions, e.g., from a high to low state. Thus, if CLK transitions to a high state, P-channel transistor 56 becomes less conductive and N-channel transistor 52 becomes more conductive than when CLK was in a low state. Simultaneously, CLK\, because it is slower, is still high and P-channel transistor 54 has a lower conductivity than N-channel transistor 50. Therefore, signal CLK's path through transistors 54, 56, 52, and 50 will be slower than signal CLK\'s path through transistors 52, 50, 54, and 56. The transition of the first signal, signal CLK in this example, is slower than the transition of the slow signal, CLK\. A similar operation occurs if CLK\ is faster than CLK with CLK\ being slowed. The output signals CLK and CLK\ on terminals 68 and 79, respectively, exhibit reduced skew due to the use of the skew reducing circuit 12.

Figure 4:
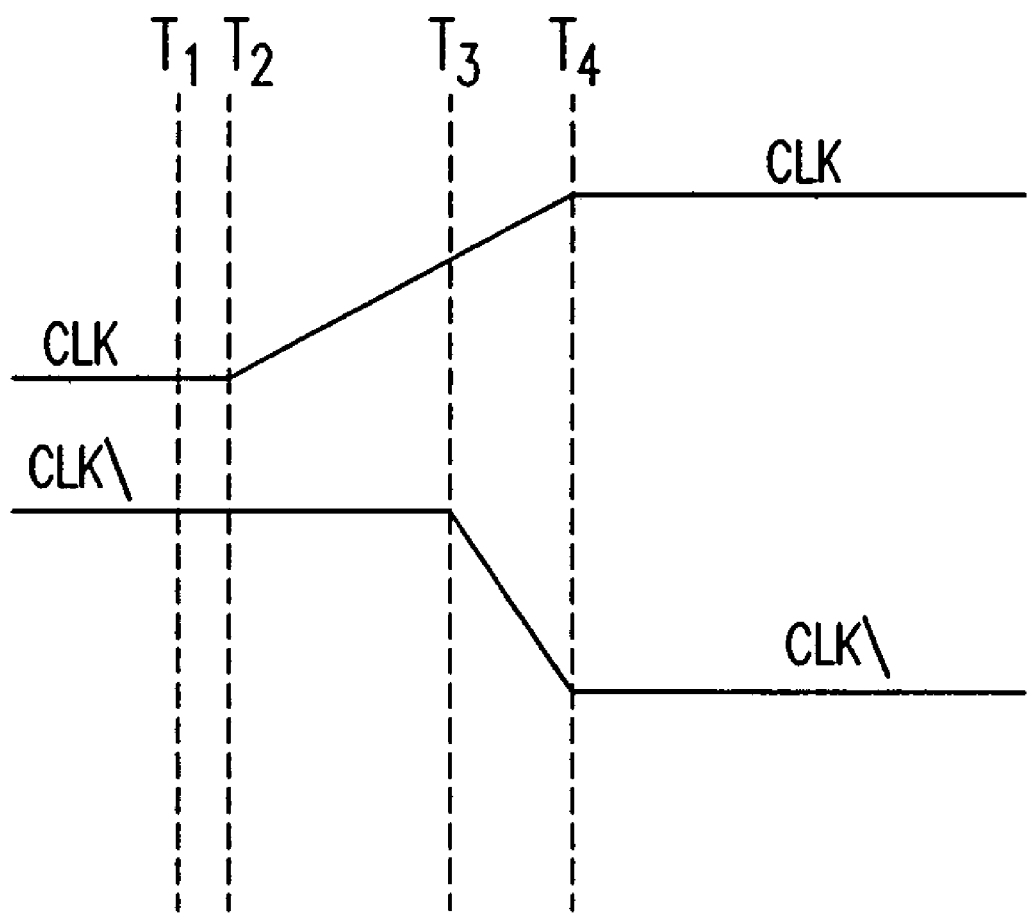
FIG. 4 is a timing diagram of the operation of the circuit of FIG. 3.

More particularly, operation of the clock skew reducing circuit 12 is illustrated in the timing diagram shown in FIG. 4. We again assume for discussion that CLK is faster than CLK\. Signal CLK is low and signal CLK\ is high at time $T_1$ as both signals enter the clock skew reducing circuit 12. A brief period after $T_1$, at time $T_2$, signal CLK transitions to a high state. Signal CLK\ begins to transition to a low state at time $T_3$. The difference between $T_2$ and $T_3$ represents the skew of the signals CLK and CLK\ prior to entering the clock skew reduction circuit 12. However, skew reducing circuit 12 causes both signals CLK and CLK\ to finish their respective transitions at the same time, $T_4$. Even though both signals CLK and CLK\ began their transitions with a skew, the operation of the clock skew reducing circuit 12 has greatly reduced or eliminated the skew by slowing the transition of signal CLK, the fast signal, and speeding the transition of signal CLK\, the slow signal. Alternatively, if signal CLK\ is fast and signal CLK is slow, the clock speed reducing circuit 12 will slow the transition of signal CLK\ and speed the transition of signal CLK.

Figure 5:
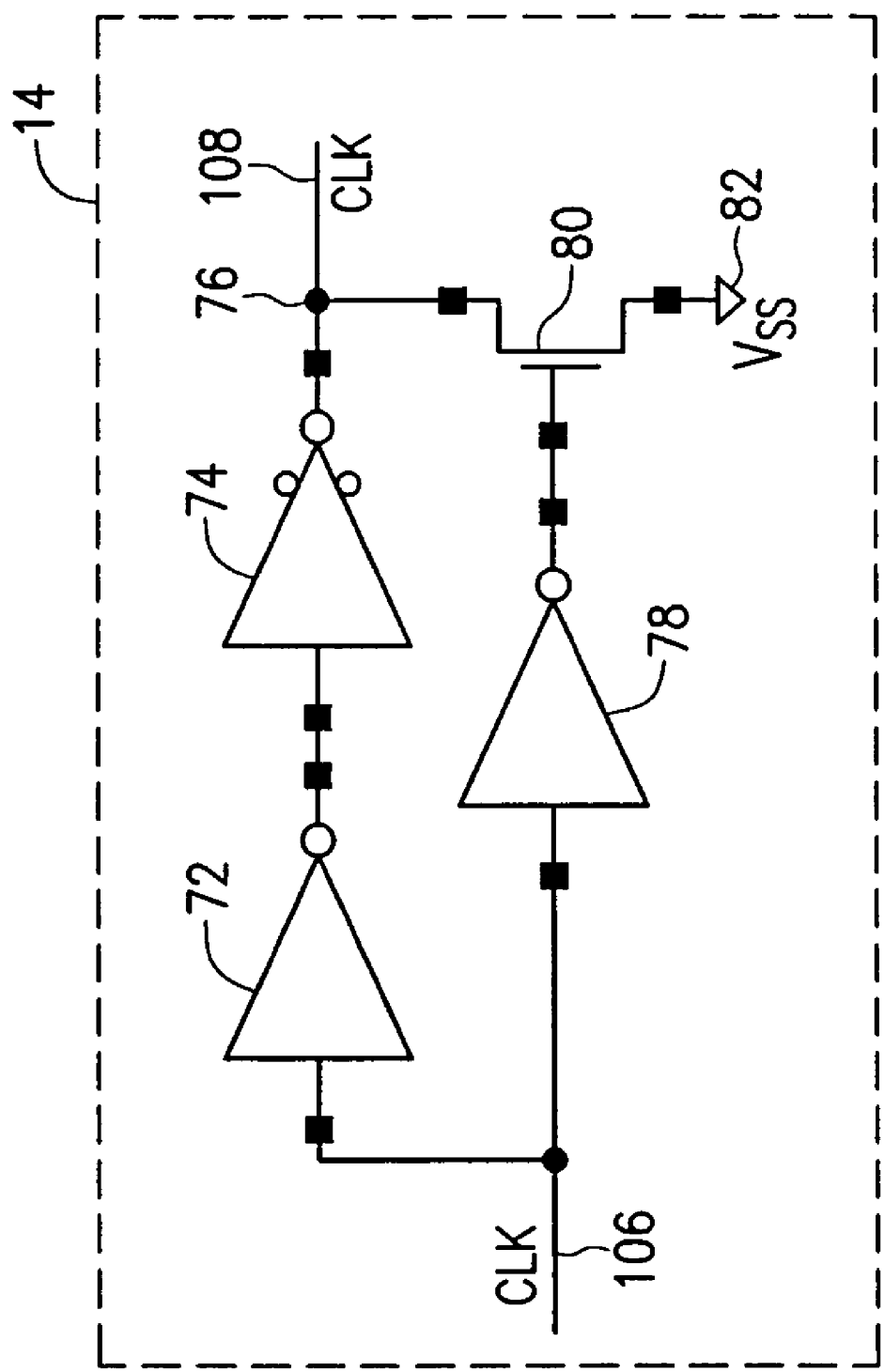
FIG. 5 is a schematic diagram of a driver circuit shown in FIG. 1.

Before being transmitted from the circuit 5, the signals CLK and CLK\ are preferably passed through driver circuits 14 and 15, respectively, to boost signal strength. A typical driver circuit 14 is shown in more detail in FIG. 5. Incoming clock signal CLK is passed through a series of at least two inverters 72 and 74 to terminal 76. The inverters 72 and 74 strengthen the signal CLK. More preferably, the driver circuit 14 has a third inverter 78 which outputs a signal that gates N-channel transistor 80. The drain for N-channel transistor 80 is ground ($V_{SS}$) 82 and the source is the output of inverter 74. In operation, when the signal CLK is high, the N-channel transistor 80 is in an off state and the boosted signal CLK at terminal 76 is output on line 108. When the signal CLK is low, the N-channel transistor 80 is in an on state and the boosted signal CLK at terminal 76 is driven to ground by $V_{SS}$ 82. Though one particular type of driver circuit 14 has been described herein, it should be understood that any driver circuit known in the art may be substituted.

Figure 6A:
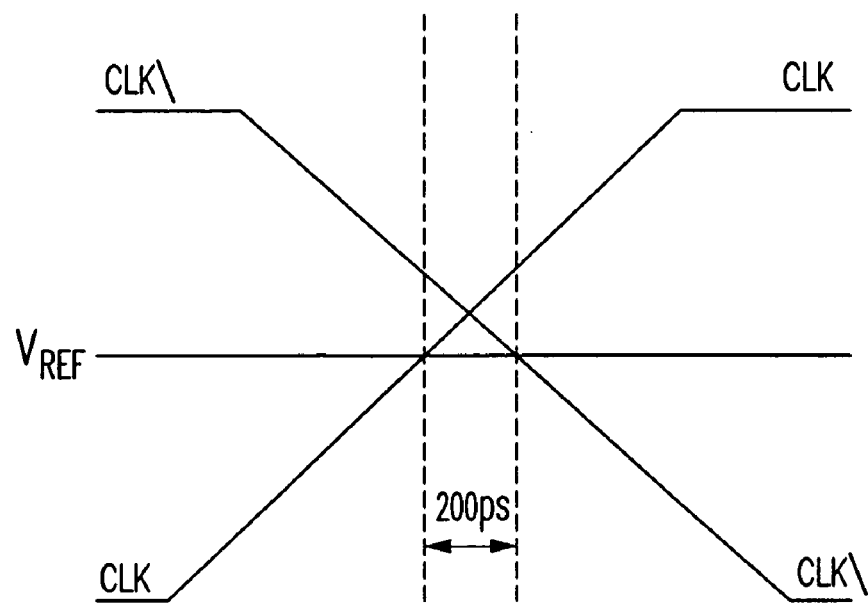
FIGS. 6a–d are timing diagrams of inverse clock signals undergoing a state transition.
Figure 6B:
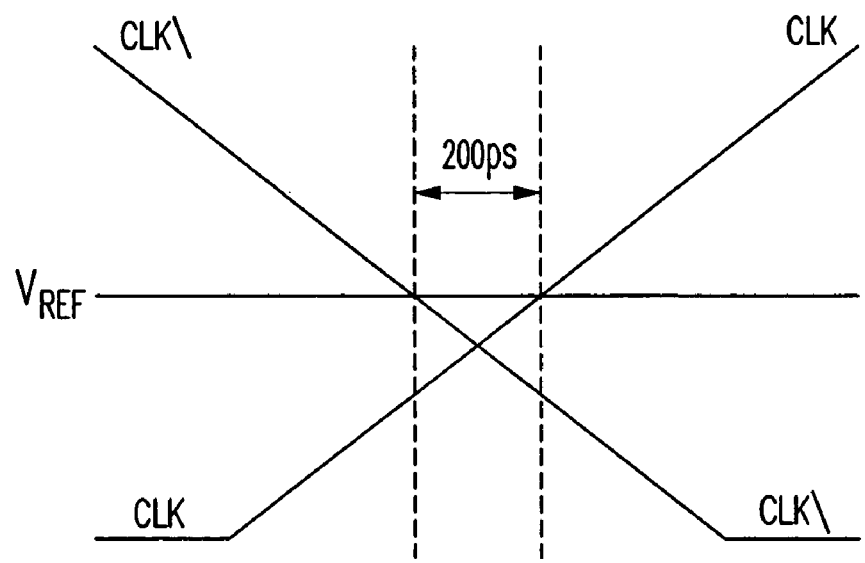
Figure 6C:
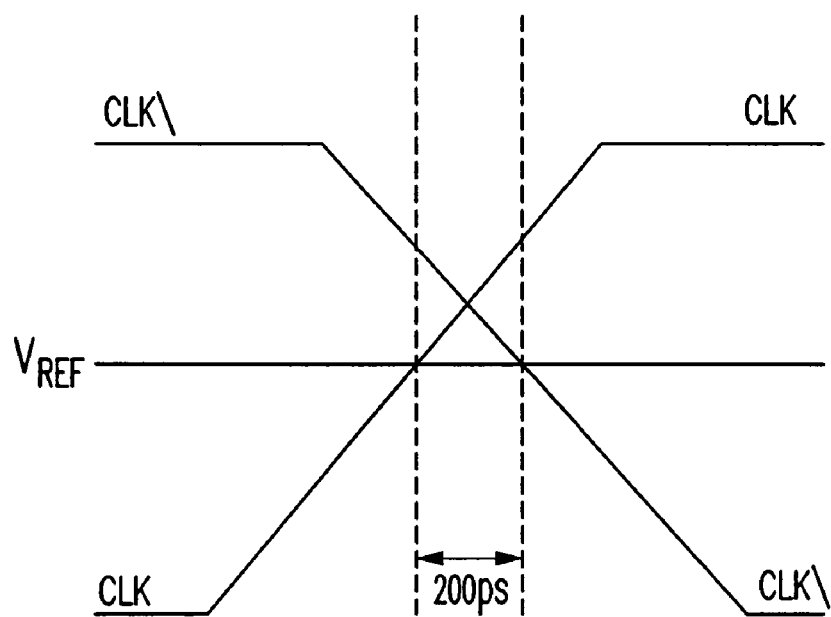
Figure 6D:
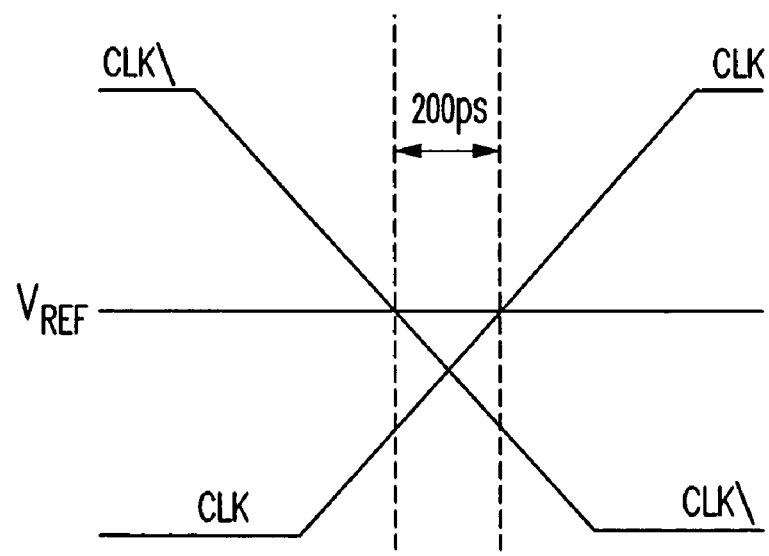
Figure 9:
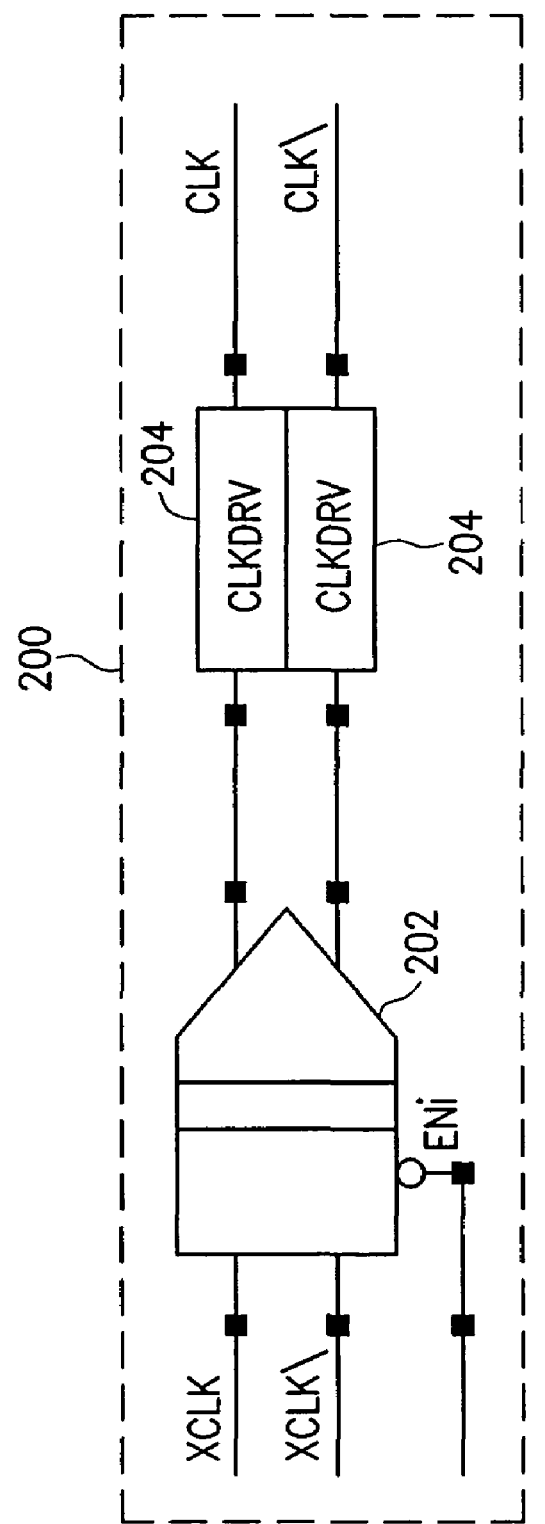
FIG. 9 is a circuit schematic of a prior art differential input buffer circuit.
Figure 10:
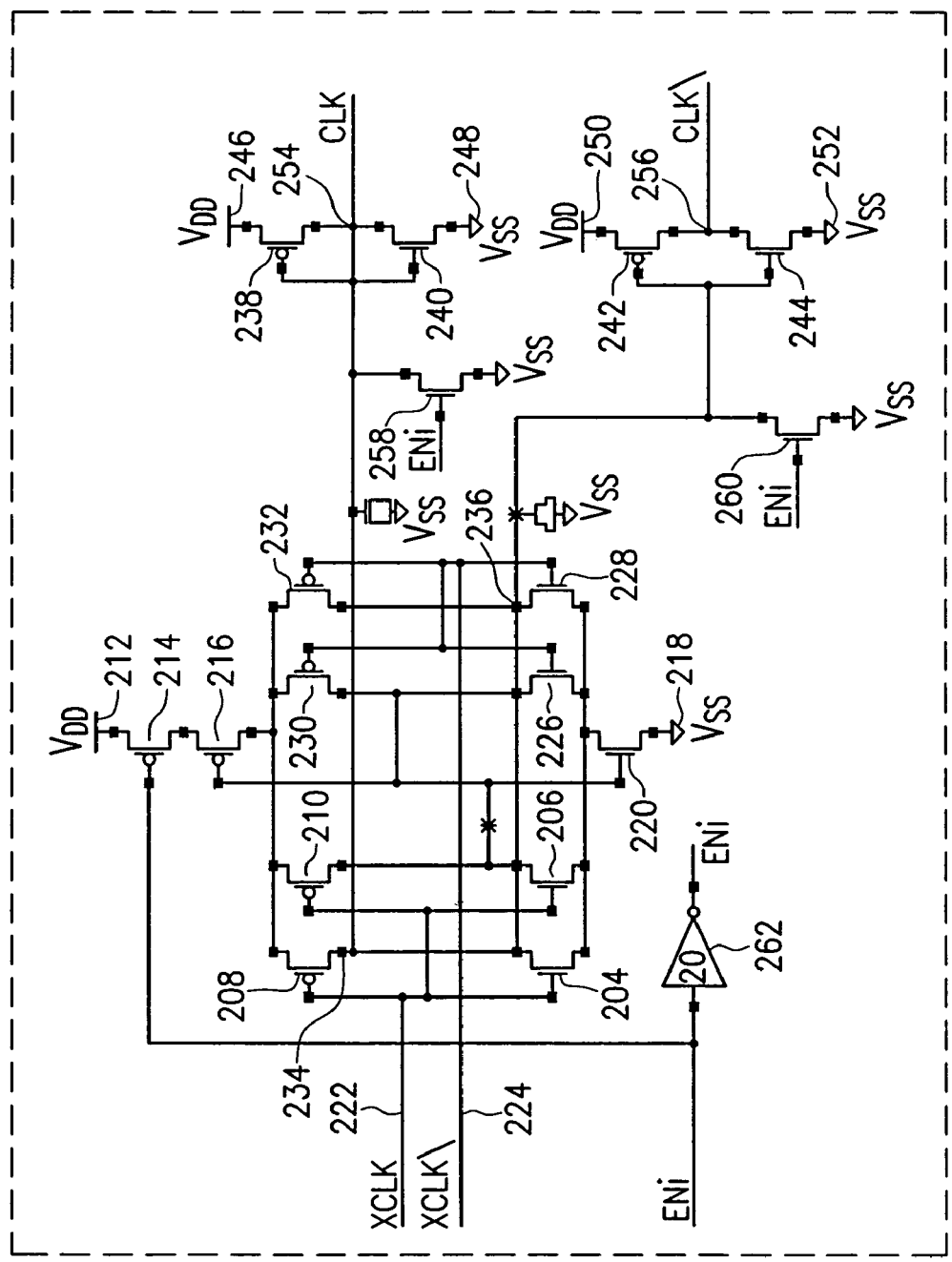
FIG. 10 is a circuit schematic of a prior art input buffer contained within the differential input buffer circuit of FIG. 9.

To demonstrate the reduction in skew produced by the present invention, two circuits were simulated across four conditions of clock skew. Circuit A was a prior art differential input buffer as shown in FIGS. 9 and 10 and described above and Circuit B was a circuit as depicted in FIGS. 1 and 2 and constructed in accordance with the present invention. The four skew conditions are shown in FIGS. 6a, 6b, 6c, and 6d. FIG. 6a shows signal XCLK transitioning from a low state to a high state, XCLK\ transitioning from a high state to a low state, $V_{REF}$ equal to 1.15 V, and a 200 ps skew between signals XCLK and XCLK\ crossing $V_{REF}$ with signal XCLK crossing $V_{REF}$ first, thus being the fast signal. FIG. 6b shows a similar condition with signal XCLK\ being fast and signal XCLK being slow. FIG. 6c shows signal XCLK transitioning from a low state to a high state, XCLK\ transitioning from a high state to a low state, $V_{REF}$ equal to 1.35 V, and a 200 ps skew between signals XCLK, the fast signal, and XCLK\, the slow signal, crossing $V_{REF}$. FIG. 6d shows a similar condition with signal XCLK\ being fast and signal XCLK being slow. To test Circuit A and Circuit B, a transmitted data/address signal crossed $V_{REF}$ at the same time that signals XCLK and XCLK\ intersected $V_{REF}$. The time difference between the data/address signal crossing $V_{REF}$ and the signal XCLK crossing $V_{REF}$ were measured, the results shown in Table 1 below.

| Environmental Conditions | Worst Case Skew Difference A picoseconds (ps) | B (ps) | Skew Difference Worst To Best A (ps) | B (ps) |
|---|---|---|---|---|
| $V_{cc}$ = 2.2; Temperature = 85 F. | 780 | 130 | 470 | 120 |
| $V_{cc}$ = 2.2; Temperature = 85 F. | 156 | 116 | 40 | 114 |
| Across $V_{cc}$ and Temperature | 780 | 130 | 660 | 130 |

A can be seen from the results in Table 1, the invention, Circuit B, saved up to 0.5 ns of the setup/hold window for data/address signals over prior art Circuit A.

Figure 7:
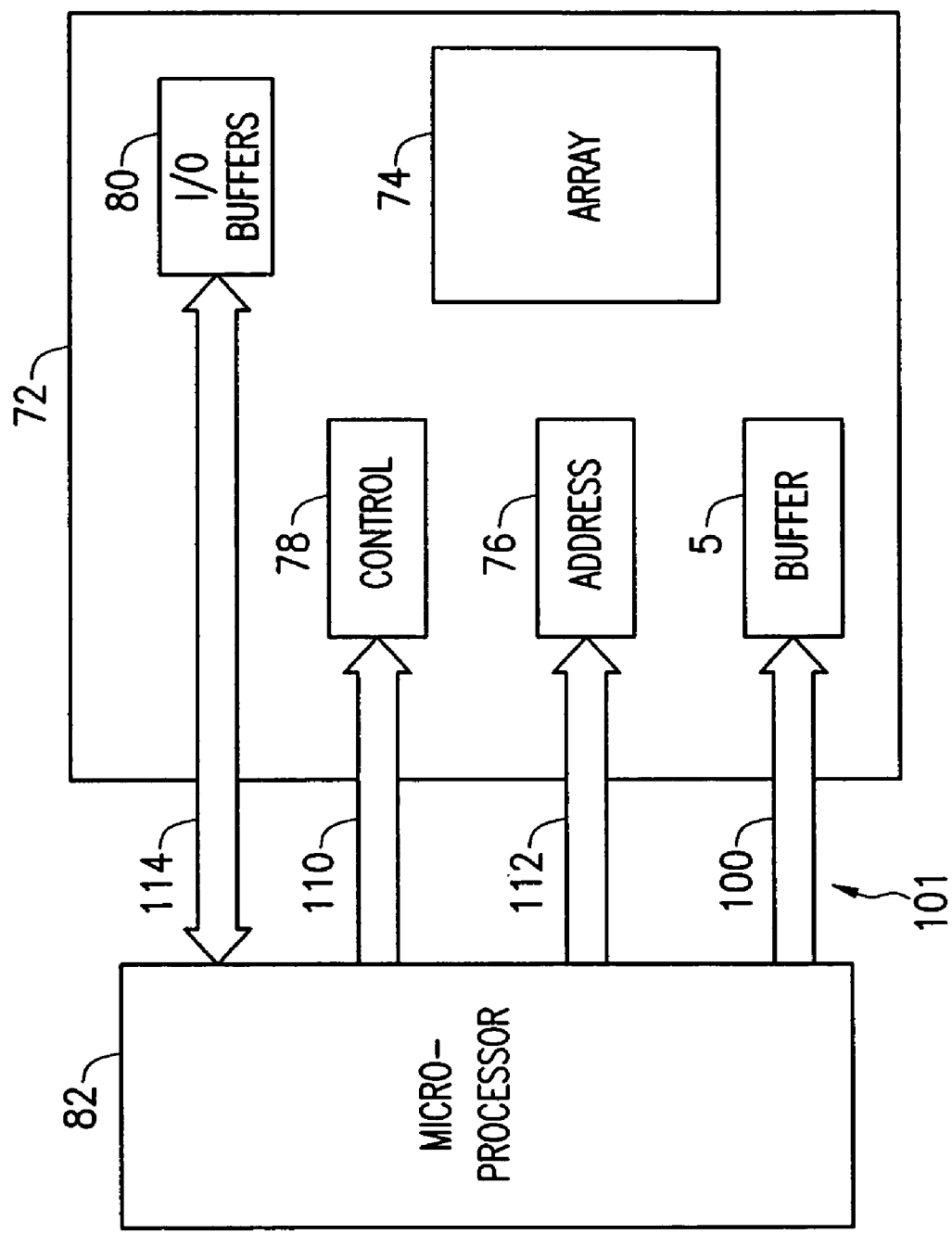
FIG. 7 is a block diagram of a memory module employing the preferred embodiment of the present invention.
Figure 8:
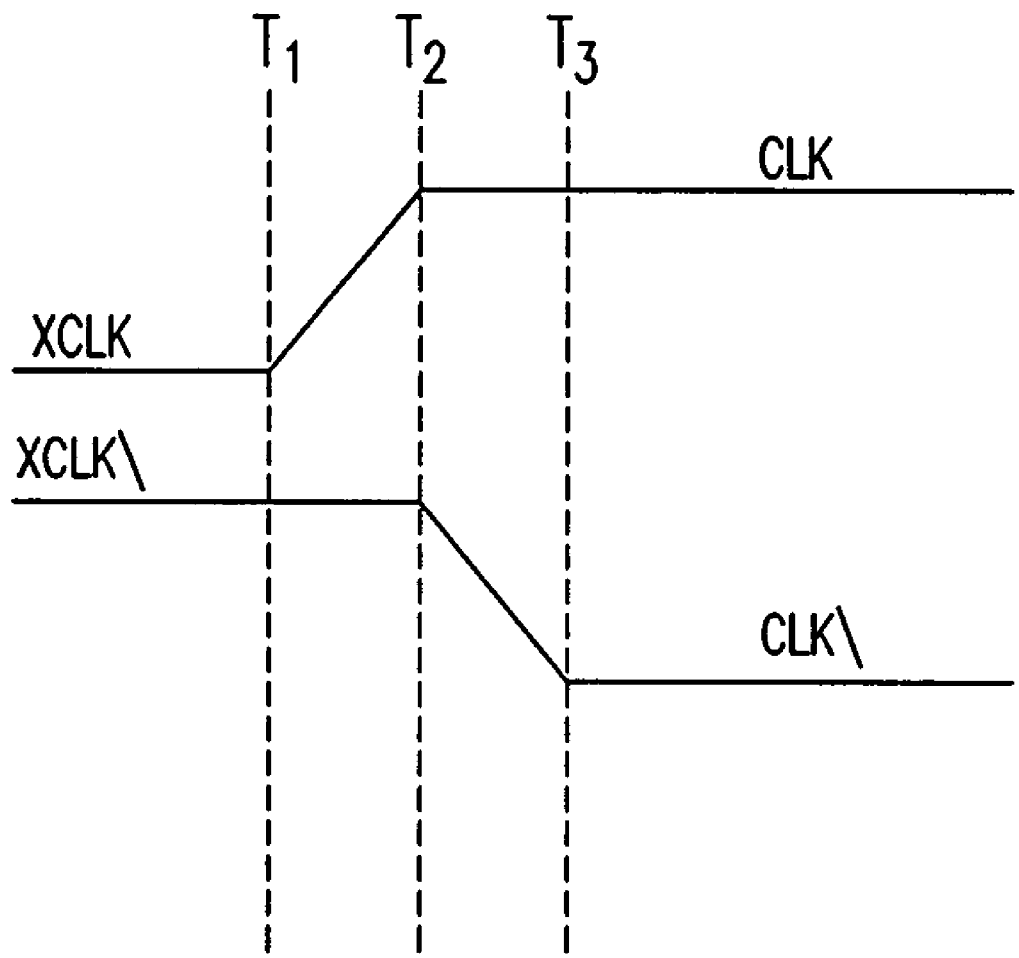
FIG. 8 is a timing diagram showing the skew between inverse clock signals.

The invention is particularly useful in an integrated memory circuit. In particular, the input buffer is useful in memory devices, for example in a double data rate synchronous dynamic random access memory (DDR SDRAM). Typically DDR SDRAM chips employ a delay on address signals to compensate for the skew in clock signals. Such a delay could be eliminated through use of the present invention. A simplified block diagram of an DDR SDRAM 72 is illustrated in FIG. 7. The DDR SDRAM 72 includes an array of memory cells 74, address circuitry 76 for addressing the memory array, clock skew reducing circuit 5, input/output (I/O) buffer circuitry 80 for data input and output, and control circuitry 78 for controlling the operation of the DDR SDRAM 72. The circuit 5 includes at least the input buffer 10, clock skew reducing circuit 12, and driver circuits 14 described above and shown in FIGS. 1–4. Also shown in FIG. 7 is an external processor 82, preferably a microprocessor, which is typically used to access memory 72 provide control signals on lines 110, address signals on lines 112, input/output data on lines 114, and clock signals CLK and CLK\ on lines 100, 101, respectively. It will be appreciated by those skilled in the art that the DDR SDRAM of FIG. 7 is simplified to illustrate the present invention and is not intended to be a detailed description of all of the features of an DDR SDRAM.

The processor 82 and memory 72 may form part of a layer general purpose computing system as shown in FIG. 11. FIG. 11 is a block diagram of a processor-based system 150 utilizing a memory 72 constructed in accordance with one of the embodiments of the present invention. The processor-based system 150 may be a computer system, a process control system or any other system employing a processor and associated memory. The system 150 includes a processor 82, e.g., a microprocessor, that communicates with the memory 72 andante I/O device 116 over a bus 118. It must be noted that the bus 118 may be a series of buses and bridges commonly used in a processor-based system, but for convenience purposes only, the bus 118 has been illustrated as a single bus. A second I/O device 120 is illustrated, but is not necessary to practice the invention. The processor-based system 150 also includes read-only memory (ROM) 122 and may include peripheral devices such as a floppy disk drive 124 and a compact disk (CD) ROM drive 126 that also communicates with the CPU 82 over the bus 118 as is well known in the art.

Although the invention has been described with reference to SDRAMS, such as regulated DDR SDRAMS, the invention has broader applicability and may be used in many integrated circuit applications. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A synchronous memory device comprising:
   an array of memory cells;
   at least one clock input for receiving at least one clock signal and for producing first and second internal clock signals; and
   a circuit for reducing skew between the first and second internal clock signals, said circuit comprising:
     first and second clock signal input/output lines for receiving and transmitting first and second internal clock signals, respectively; and
     at least first and second inverters each having an input and an output, said input of said first inverter connected to said output of said second inverter and to said first clock signal input/output line and said input of said second inverter connected to said output of said first inverter and to said second clock signal input/output line; and
     first and second input buffer circuits for receiving first and second external signals,
     wherein each of said first and second input buffer circuits comprises:
       an input for receiving an external signal;
       an input for receiving a reference voltage signal;
       a differential amplifier coupled to said input, said differential amplifier having an output terminal for providing a latch signal in response to the external signal in comparison to the reference voltage signal, the latch signal having a first or second state;
       a buffer circuit inverter connected to said output terminal of said differential amplifier, said buffer circuit inverter generating a first internal signal when the latch signal is in a first state, and a second internal signal when the latch signal is in a second state; and an input line for transmitting said first or second internal signal, said input line connected to one of said first and second signal input/output lines.

2. The synchronous memory device of claim 1, wherein said circuit for reducing skew further comprises an enable circuit for receiving an enable signal and enabling or disabling said first and second inverters in response to the enable signal.

3. The synchronous memory device of claim 2, wherein said enable circuit comprises:

a first voltage source for supply of a first voltage to said first inverter and said second inverter, said first voltage supply being gated to said inverters by the enable signal;

an enable inverter for inverting the enabling signal; and a second voltage source for supplying a second voltage to said second inverter and said first inverter, said second voltage source being gated to said first and second inverters by the inverted enable signal.

4. The synchronous memory device of claim 3, wherein said first voltage source is gated by a P-channel transistor responsive to the enable signal.

5. The synchronous memory device of claim 3, wherein said second voltage source is gated by a N-channel transistor responsive to the inverse of the enable signal.

6. The synchronous memory device of claim 3, wherein said first voltage source is gated by an N-channel transistor responsive to the enable signal.

7. The synchronous memory device of claim 3, wherein said second voltage source is gated by an P-channel transistor responsive to the inverse of the enable signal.

8. The synchronous memory device of claim 1, further comprising an enable circuit for receiving said enable signal and enabling or disabling said first and second input buffer circuits in response to the enable signal.

9. The synchronous memory device of claim 1, further comprising a first and second driver circuit for boosting said output signal, said first and second driver circuit connected to said first and second clock signal input/output lines, respectively.

10. The synchronous memory device of claim 9, wherein at least one of said first and second driver circuits comprises at least a first and second driver inverter connected in series.

11. The synchronous memory device of claim 10, further comprising at least a third driver inverter connected in parallel to said first and second driver inverters, the output of said third driver inverter gating the output of said first and second driver inverters to a predetermined voltage.

12. A synchronous memory device comprising:

an array of memory cells;

a clock input for receiving a clock signal; and a clock input buffer comprising:

a first and second input buffer circuit for receiving a first and second external clock signal, respectively, each of said input buffer circuits comprising:

an input for receiving an external clock signal;

a differential amplifier coupled to the input, said differential amplifier having an output terminal for providing a latch signal in response to the external clock signal, the latch signal having a first or second state;

a first inverter connected to said output terminal, said first inverter generating an internal clock signal in response to the latch signal, said first inverter generating a first internal clock signal when the latch signal is in a first state, and a second internal clock signal when the latch signal is in a second state; and a circuit for reducing skew between the first and second internal clock signals, said circuit comprising:

first and second clock signal input/output lines for receiving and transmitting first and second internal clock signals, respectively; and at least second and third inverters each having an input and an output, said input of said second inverter connected to said output of said third inverter and to said first clock signal input/output line and said input of said third inverter connected to said output of said second inverter and to said second clock signal input/output line.

13. The synchronous memory device of claim 12, wherein the memory device is a synchronous dynamic random access memory (SDRAM).

14. The synchronous memory device of claim 12, further comprising an enable circuit for receiving an enable signal and enabling or disabling said first and second input buffer circuits and said second and third inverters in response to the enable signal.

15. The synchronous memory device of claim 12, further comprising a first and second driver circuit for boosting said internal clock signal, said first and second driver circuit connected to said first and second clock signal input/output lines, respectively.

16. The synchronous memory device of claim 15, wherein at least one of said first and second driver circuits comprises at least a first and second driver inverter connected in series.

17. The synchronous memory device of claim 15, wherein at least one of said first and second driver circuits comprises at least first and second driver inverters connected in series and at least a third driver inverter connected in parallel to said first and second driver inverters, the output of said third driver inverter gating the output of said first and second driver inverters to ground.

18. A computer system comprising:

a processor; and a memory circuit connected to said processor, said memory circuit comprising:

an array of memory cells;

a clock input for receiving a clock signal; and a clock input buffer comprising:

a first and second input buffer circuit for receiving a first and second external clock signal, respectively, each of said input buffer circuits comprising:

an input for receiving an external clock signal;

a differential amplifier coupled to the input, said differential amplifier having an output terminal for providing a latch signal in response to the external clock signal, the latch signal having a first or second state;

a first inverter connected to said output terminal, said first inverter generating an internal clock signal in response to the latch signal, said first inverter generating a first internal clock signal when the latch signal is in a first state, and a second internal clock signal when the latch signal is in a second state; and a circuit for reducing skew between the first and second internal clock signals, said circuit comprising:

first and second clock signal input/output lines for receiving and transmitting first and second internal clock signals, respectively; and at least second and third inverters each having an input and an output, said input of said second inverter connected to said output of said third inverter and to said first clock signal input/output line and said input of said third inverter connected to said output of said second inverter and to said second clock signal input/output line.

19. The computer system of claim 18, wherein said memory circuit is a synchronous dynamic random access memory (SDRAM).

20. The computer system of claim 18, wherein said memory circuit further comprises an enable circuit for receiving an enable signal and enabling or disabling said first and second input buffer circuits and said second and third inverters in response to the enable signal.

21. The computer system of claim 18, wherein said memory circuit further comprises a first and second driver circuit for boosting said internal clock signal, said first and second driver circuit connected to said first and second clock signal input/output lines, respectively.

22. The computer system of claim 21, wherein at least one of said first and second driver circuits comprises at least a first and second driver inverter connected in series.

23. The computer system of claim 21, wherein at least one of said first and second driver circuits comprises at least first and second driver inverters connected in series and at least a third driver inverter connected in parallel to said first and second driver inverters, the output of said third driver inverter gating the output of said first and second driver inverters to ground.

24. A method of generating an internal clock signal in an integrated circuit, the method comprising the steps of:
receiving first and second external clock signals, wherein the second external clock signal is an inverse of the first external clock signal and where there exists a time lag of one of said external clock signals relative to the other;
modifying the transition of one of said external clock signals relative to the other to produce from said external clock signals internal clock signals which have reduced skew;
buffering each of the first and second external clock signals using a reference voltage.

25. The method of claim 24, wherein said step of modifying the transition of one of said buffered external clock signals comprises the step of transmitting each of said buffered external clock signals through series connected complimentary transistors, the respective connection terminal of said series connected complimentary transistors being coupled to respective input/output lines for receiving said first and second external clock signals.

26. The method of claim 24, wherein said step of modifying the transition of one of said buffered external clock signals comprises the steps of:
speeding the transition of said buffered external clock signal having a time lag; and
slowing the transition of the other of said buffered external clock signals.

27. A method of generating an internal clock signal in an integrated circuit, the method comprising the steps of:
receiving first and second external clock signals, wherein the second external clock signal is an inverse of the first external clock signal and where there exists a time lag of one of said external clock signals relative to the other;
buffering each of the first and second external clock signals using a reference voltage; and
modifying the transition of one of said buffered external clock signals relative to the other to produce from said buffered external clock signals internal clock signals which have reduced skew.

28. The method of claim 27, wherein said step of modifying the transition of one of said buffered external clock signals comprises the steps of:
speeding the transition of said buffered external clock signal having a time lag; and
slowing the transition of the other of said buffered external clock signals.

29. The method of claim 27, wherein said step of modifying the transition of one of said buffered external clock signals comprises the step of transmitting each of said buffered external clock signals through series connected complimentary transistors, the respective connection terminal of said series connected complimentary transistors being coupled to respective input/output lines for receiving said first and second external clock signals.

30. The method of claim 27, further comprising the step of driving each of said internal clock signals.

31. The method of claim 30, wherein said random access memory comprises a dynamic random access memory.

32. The method as in claim 31, wherein said memory circuit comprises a dynamic random access memory.

33. The method of claim 27, wherein said act of receiving first and second external clock signals is performed in connection with the operation of a random access memory.

34. The method of claim 27, further comprising transmitting said internal clock signals to a memory circuit.

* * * * *

UNITED STATES PATENT AND TRADEMARK OFFICE
CERTIFICATE OF CORRECTION

| | | |
|---|---|---|
| PATENT NO. | : 7,116,133 B2 | Page 1 of 1 |
| APPLICATION NO. | : 10/870138 | |
| DATED | : October 3, 2006 | |
| INVENTOR(S) | : Christopher K. Morzano | |

It is certified that error appears in the above-identified patent and that said Letters Patent is hereby corrected as shown below:

Column 7, line 63, "72 provide" should read --72 and provides--; and

Column 8, lines 4-5, "a layer general" should read --a general--.

Column 8, line 13, "72 andante I/O" should read --72 and an I/O--.

Claim 7, column 9, line 34, "an P-channel" should read --a P-channel;--.

Signed and Sealed this

Twenty-sixth Day of December, 2006

JON W. DUDAS
*Director of the United States Patent and Trademark Office*